United States Patent
Wu et al.

(10) Patent No.: US 12,288,701 B2
(45) Date of Patent: Apr. 29, 2025

(54) MULTI-CHAMBER SEMICONDUCTOR MANUFACTURING SYSTEM

(71) Applicant: Syskey Technology Co., Ltd., Hsinchu County (TW)

(72) Inventors: Hsueh-Hsien Wu, Hsinchu (TW); Chih-Yuan Chan, Hsinchu County (TW); Yi-Ting Lai, Hsinchu County (TW)

(73) Assignee: SYSKEY TECHNOLOGY CO., LTD., Hsinchu County (TW)

( * ) Notice: Subject to any disclaimer, the term of this patent is extended or adjusted under 35 U.S.C. 154(b) by 561 days.

(21) Appl. No.: 17/682,457

(22) Filed: Feb. 28, 2022

(65) Prior Publication Data
US 2023/0274958 A1    Aug. 31, 2023

(51) Int. Cl.
*H01L 21/67*        (2006.01)
*H01L 21/677*       (2006.01)
*H01L 21/687*       (2006.01)

(52) U.S. Cl.
CPC .. *H01L 21/67196* (2013.01); *H01L 21/67167* (2013.01); *H01L 21/6719* (2013.01); *H01L 21/67201* (2013.01); *H01L 21/68771* (2013.01); *H01L 21/67742* (2013.01)

(58) Field of Classification Search
CPC ......... H01L 21/67196; H01L 21/67167; H01L 21/67201; H01L 21/68771; H01L 21/6719; H01L 21/67742
See application file for complete search history.

(56) References Cited

U.S. PATENT DOCUMENTS

| | | | | |
|---|---|---|---|---|
| 4,630,417 A | * | 12/1986 | Collier | F24F 7/10 174/487 |
| 4,852,516 A | * | 8/1989 | Rubin | H01L 21/67748 219/393 |
| 4,874,127 A | * | 10/1989 | Collier | H05K 7/20745 236/49.5 |
| 5,838,121 A | * | 11/1998 | Fairbairn | H01L 21/68707 901/14 |
| 6,110,232 A | * | 8/2000 | Chen | H01L 21/67201 29/25.01 |
| 6,277,199 B1 | * | 8/2001 | Lei | H01L 21/67161 118/698 |
| 6,312,525 B1 | * | 11/2001 | Bright | H01L 21/67196 204/298.25 |
| 6,558,506 B1 | * | 5/2003 | Freeman | H01L 21/67167 156/345.31 |
| 6,860,965 B1 | * | 3/2005 | Stevens | C23C 14/566 156/345.31 |

(Continued)

*Primary Examiner* — Jeffrie R Lund
(74) *Attorney, Agent, or Firm* — Muncy, Geissler, Olds & Lowe, P.C.

(57) ABSTRACT

A multi-chamber semiconductor manufacturing system is provided, including: a base, a plurality of processing units and a transfer unit. The base includes a main body and a plurality of supporting frames protrudingly disposed on a mounting surface of the main body. The plurality of processing units are connected to the plurality of supporting frames. The transfer unit is connected to the plurality of supporting frames and located between the plurality of processing units. The transfer unit is configured to transfer a substrate between the plurality of processing units. An aspect ratio value of the base is between 1 and 3.

9 Claims, 6 Drawing Sheets

(56) References Cited

U.S. PATENT DOCUMENTS

| | | | | |
|---|---|---|---|---|
| 7,032,614 B2* | 4/2006 | Lappen | B23Q 1/01 | 204/298.25 |
| 7,335,277 B2* | 2/2008 | Makino | H01L 21/6719 | 156/345.31 |
| 8,060,252 B2* | 11/2011 | Gage | H01L 21/67742 | 901/6 |
| 9,312,153 B2* | 4/2016 | Hiroki | H01L 21/67161 | |
| 9,312,155 B2* | 4/2016 | Mori | C23C 16/52 | |
| 9,502,275 B1* | 11/2016 | Trussell | H01L 21/67178 | |
| 9,613,837 B2* | 4/2017 | Senzaki | H01L 21/6719 | |
| 11,393,705 B2* | 7/2022 | Daugherty | H01L 21/67201 | |
| 11,527,426 B2* | 12/2022 | Tsuji | H01L 21/67161 | |
| 2002/0084402 A1* | 7/2002 | Schauer | H01L 21/67017 | 248/678 |
| 2003/0166390 A1* | 9/2003 | Green | B23Q 1/01 | 52/263 |
| 2003/0168175 A1* | 9/2003 | Kim | H01L 21/68 | 118/728 |
| 2006/0045665 A1* | 3/2006 | Hall | H01L 21/67196 | 414/217 |
| 2008/0152463 A1* | 6/2008 | Chidambaram | H01L 21/67742 | 414/217 |
| 2009/0214399 A1* | 8/2009 | Yatomi | H01L 21/67196 | 422/186.04 |
| 2009/0324367 A1* | 12/2009 | Isozaki | H01L 21/67196 | 414/217.1 |
| 2010/0158642 A1* | 6/2010 | Duer | H01L 21/67167 | 414/217 |
| 2012/0091386 A1* | 4/2012 | Tauchi | H01L 21/67126 | 251/366 |
| 2012/0199065 A1* | 8/2012 | Wieting | H01L 21/67736 | 118/704 |
| 2015/0082613 A1* | 3/2015 | Shinozaki | H01L 21/68742 | 29/559 |
| 2019/0148177 A1* | 5/2019 | Yin | H01L 21/67167 | 414/221 |
| 2019/0295873 A1* | 9/2019 | Hirochi | H01L 21/67742 | |
| 2021/0331499 A1* | 10/2021 | Mauck | B41J 29/377 | |
| 2023/0274958 A1* | 8/2023 | Wu | H01L 21/67742 | 156/345.31 |

* cited by examiner

MULTI-CHAMBER SEMICONDUCTOR MANUFACTURING SYSTEM

BACKGROUND OF THE INVENTION

Field of the Invention

The present invention relates to a multi-chamber semiconductor manufacturing system.

Description of the Prior Art

Vacuum technology plays an important role in the semiconductor industry. Semiconductor manufacturing processes such as sputtering, lithography, and etching require to be performed in a vacuum chamber to reduce the influence of gas molecules on a substrate to be processed and ensure production quality.

In the semiconductor manufacturing processes, different types of processing systems are respectively connected to a transfer chamber, and at least one robotic arm is disposed in the transfer chamber to transfer wafers between the processing systems and a storage space for automatic processing and manufacturing of semiconductor components. However, the processing systems are floor-standing devices and are disposed individually on the ground, which is inconvenient to be moved after assembling; and the processing systems are inconvenient to be assembled to the transfer chamber when the specifications of the processing systems and the transfer chamber are inconsistent with one another. In addition, the conventional semiconductor manufacturing system has disadvantages of large device volume, high construction cost, long manufacturing times and poor production efficiency and is easy to cause waste of costs in small batch production.

The present invention is, therefore, arisen to obviate or at least mitigate the above-mentioned disadvantages.

SUMMARY OF THE INVENTION

The main object of the present invention is to provide a multi-chamber semiconductor manufacturing system that has a small device volume and is convenient to assemble and move.

To achieve the above and other objects, the present invention provides a multi-chamber semiconductor manufacturing system, including: a base, a plurality of processing units and a transfer unit. The base includes a main body and a plurality of supporting frames protrudingly disposed on a mounting surface of the main body. The plurality of processing units are connected to the plurality of supporting frames. The transfer unit is connected to the plurality of supporting frames and located between the plurality of processing units. The transfer unit is configured to transfer a substrate between the plurality of processing units. An aspect ratio value of the base is between 1 and 3.

The present invention will become more obvious from the following description when taken in connection with the accompanying drawings, which show, for purpose of illustrations only, the preferred embodiment(s) in accordance with the present invention.

DETAILED DESCRIPTION OF THE PREFERRED EMBODIMENTS

Figure 1:
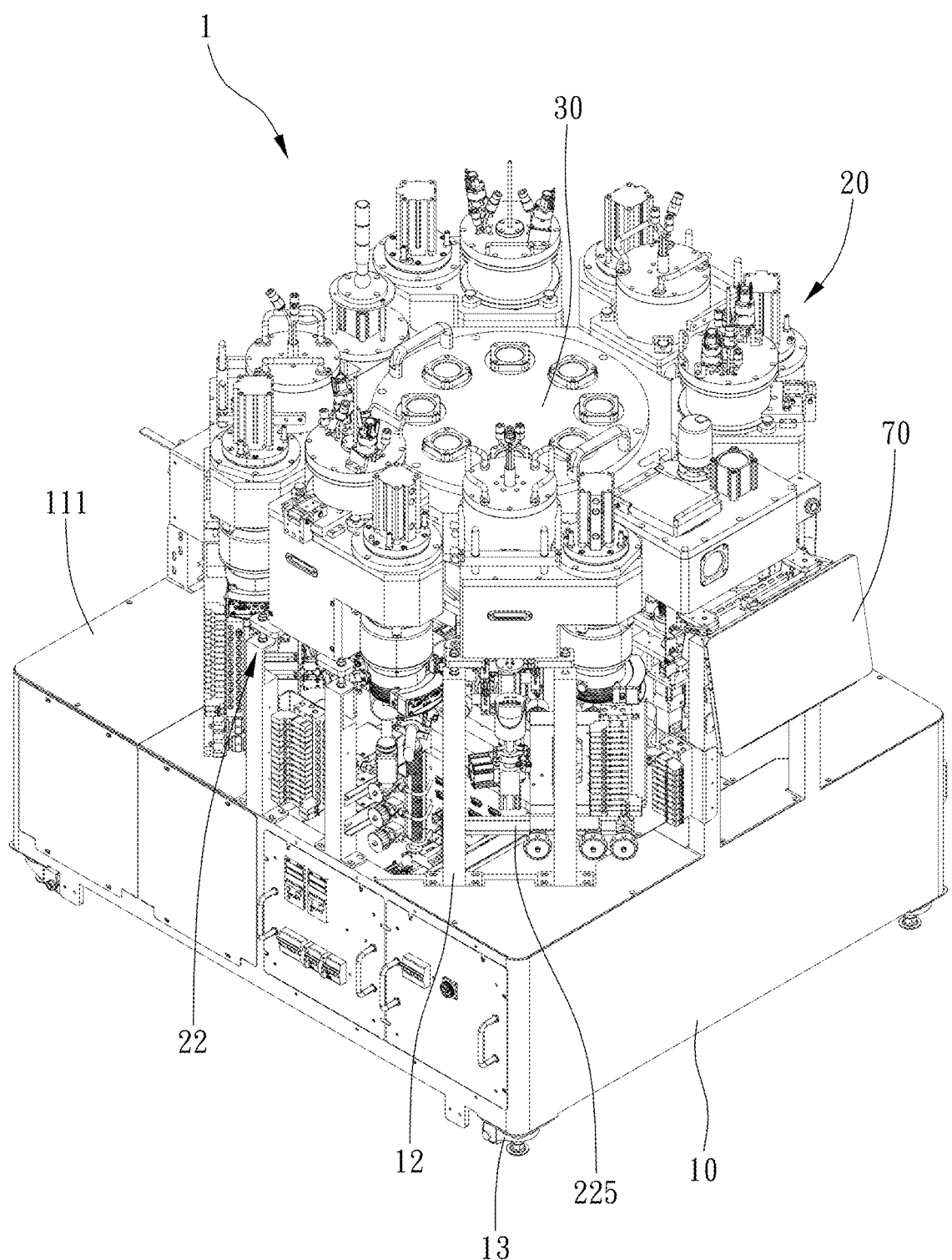
FIG. 1 is a stereogram of a preferable embodiment of the present invention.

Please refer to FIGS. 1 to 6 for a preferable embodiment of the present invention. A multi-chamber semiconductor manufacturing system 1 of the present invention includes a base 10, a plurality of processing units 20 and a transfer unit 30.

The base 10 includes a main body 11 and a plurality of supporting frames 12 protrudingly disposed on a mounting surface 111 of the main body 11. The plurality of processing units 20 are connected to the plurality of supporting frames 12. The transfer unit 30 is connected to the plurality of supporting frames 12 and located between the plurality of processing units 20. The transfer unit 30 is configured to transfer a substrate between the plurality of processing units 20. An aspect ratio value of the base 10 is between 1 and 3. Therefore, the plurality of processing units 20 are integrated with the base 10 so that the multi-chamber semiconductor manufacturing system 1 has a small volume and is convenient to assemble and move.

The transfer unit 30 includes a transfer chamber 31, and the transfer chamber 31 has a plurality of first transfer channels 311 circumferentially disposed thereon. Each of the plurality of processing units 20 includes a processing chamber 21 which includes a second transfer channel 211 communicated with an interior of the processing chamber 21 and being correspondingly communicatable with one of the plurality of first transfer channels 311, which allows at least one robotic arm disposed in the transfer chamber 31 to transfer the substrate between said processing chambers 21 and the transfer chamber 31 for automatic manufacturing. The transfer chamber 31 includes a plurality of sidewalls 312 connected transitionally with one another, and each of the plurality of sidewalls 312 has one of the plurality of first transfer channels 311. An angle between adjacent two of the plurality of sidewalls 312 is larger than or equal to 120 degrees so that the plurality of processing units 20 and the transfer unit 30 are arranged compactly and the transfer unit 30 can be assembled with more of the plurality of processing units 20. Preferably, each of the plurality of sidewalls 312 further has a sealing member 313 disposed around one of the plurality of first transfer channels 311 so as to provide air-tight effect and assembling stability. Any one of the plurality of first transfer channels 311 which is not communicated with one said second transfer channel 211 (i.e., no connection with one said processing chambers 21) is air-tightly covered with a cover plate 314 so as to avoid pressure changes during operation. In other words, the transfer unit 30 is selectively assembled with one or more of the plurality of processing units 20 to meet various manufacturing requirements. The plurality of processing units 20 may include a chemical vapor deposition system, sputtering system, thermal evaporation system, atomic deposition system and etching system, etc., which can be arranged according to various requirements and is convenient to use.

Figure 2:
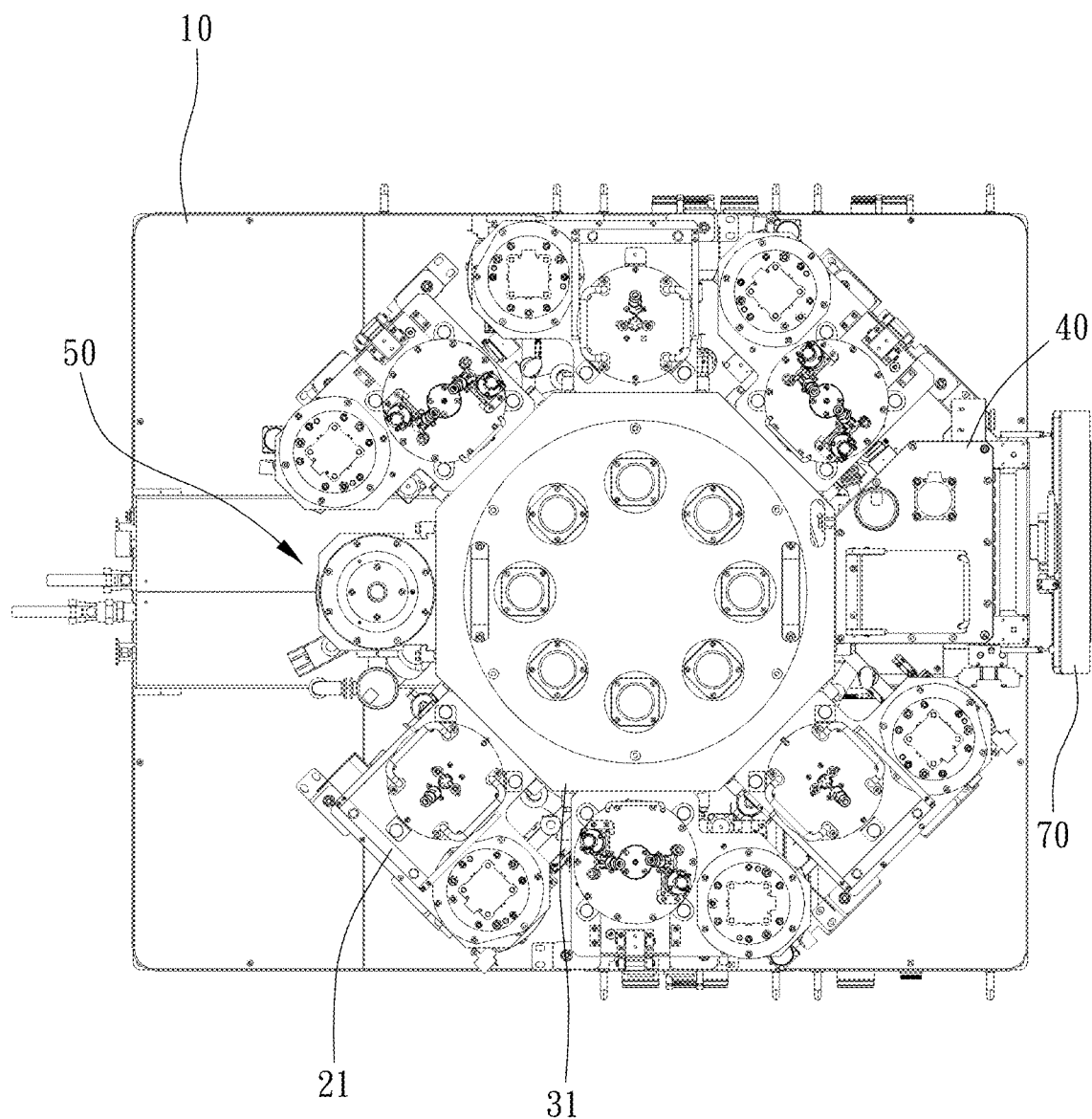
FIG. 2 is a top view of a preferable embodiment of the present invention.
Figure 3:
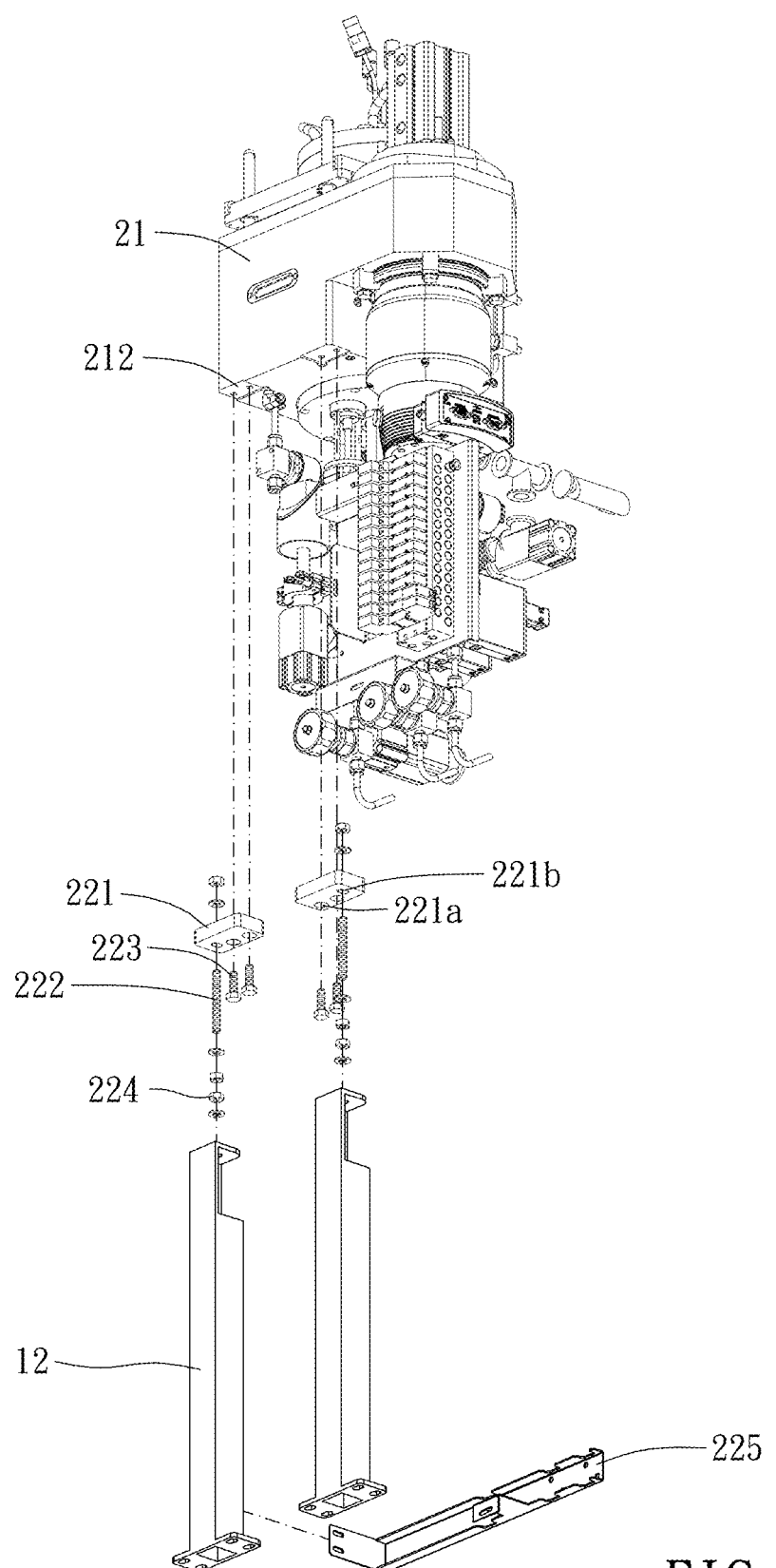
FIG. 3 is a breakdown drawing of a connection assembly and a processing unit according to a preferable embodiment of the present invention.

Preferably, a length of the base 10 and a width of the base 10 are respectively smaller than or equal to 1.8 m so as to effectively reduce an area occupied by the multi-chamber semiconductor manufacturing system 1. As viewed in a height direction of the base 10, each of the plurality of processing units 20 does not protrude beyond an outer contour of the base 10, as shown in FIG. 2, which avoids unexpected collision during movement. In this embodiment, as viewed in the height direction, the outer contour of the base 10 is rectangular, the length of the base 10 is between 0.9 m and 1.2 m, and the width of the base 10 is between 1.2 m and 1.5 m; as viewed in the height direction, the transfer chamber 31 has an outer contour which is octagonal, the angle of adjacent two of the plurality of sidewalls 312 is 135 degrees so that the transfer unit 30 can be connected with at least six said processing units 20 for several manufacturing processes. A side of the main body 11 opposite to the mounting surface 111 has a plurality of casters 13, which is convenient to move the multi-chamber semiconductor manufacturing system 1. In other embodiments, as viewed in the height direction, at least ⅔ of each of the plurality of processing units may be located within the outer contour of the base; and outer contours of the base and the transfer chamber may respectively be formed in other shapes.

Figure 4:
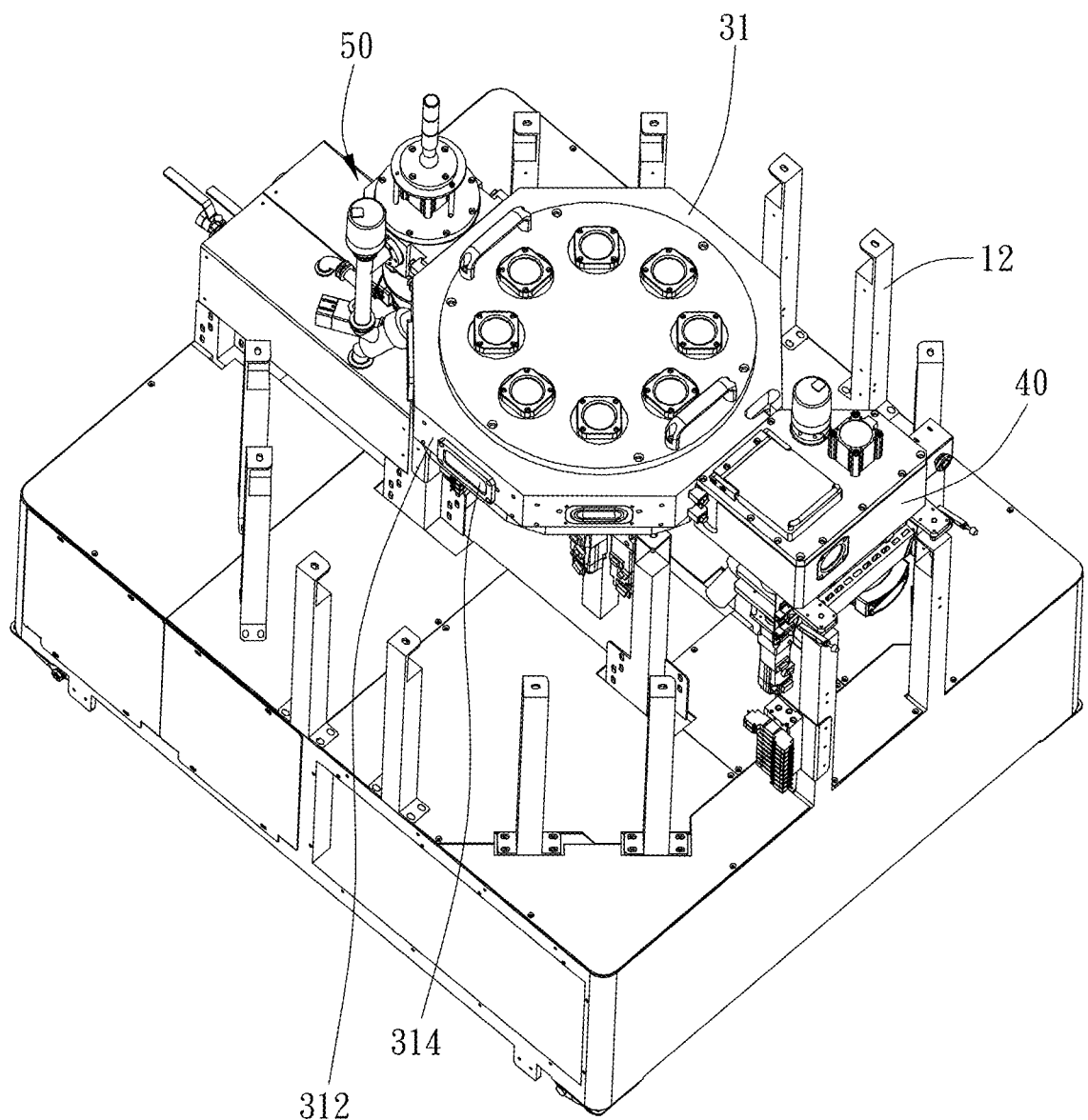
FIG. 4 is a partial stereogram according to a preferable embodiment of the present invention.

At least a portion of the plurality of supporting frames 12 is detachably assembled to the mounting surface 111, as shown in FIG. 4, which can be assembled to meet different requirements; at least a portion of the plurality of supporting frames 12 is integrally formed as a part of the main body 11 for assembling inherent equipment such as the transfer unit 30. Specifically, a connection assembly 22 is disposed on a side of each of the plurality of processing units 20 remote from the transfer unit 30, and each said connection assembly 22 includes at least one abutting member 221 connected with one of the plurality of processing units 20 and at least one connecting rod 222 connecting one said abutting member 221 and one of the plurality of supporting frames 12. Please refer to FIGS. 3 and 4, an end of each of the plurality of supporting frames 12 remote from the mounting surface 111 includes a connecting hole 121 and a notch 122, and each said connecting rod 222 is disposed through one said connecting hole 121 and partially exposed from one said notch 122 for easy positioning and assembling. A side of a bottom wall of each said processing chamber 21 remote from the transfer chamber 31 has two engaging grooves 212 spaced apart from each other, and each said abutting member 221 is embedded within one of the two engaging grooves 212 so as to have good assembling stability. Each said abutting member 221 includes at least one first through hole 221a and a second through hole 221b, and at least one fastener 223 is disposed through the at least one first through hole 221a and connects one said abutting member 221 with one said processing chamber 21. Each said connecting rod 222 is a threaded rod penetrating through the second through hole 221b, and a plurality of nuts 224 are screwed to the threaded rod and abutted against one said abutting member 221 and one of the plurality of supporting frames 12 so that a height of each said processing chamber 21 can be adjusted by changing positions of the plurality of nuts 224 relative to the threaded rod. Preferably, each said connection assembly 22 further includes a reinforcement frame 225 which is detachably connected with adjacent two of the plurality of supporting frames 12, and one of the plurality of processing units 20 is partially located between two said supporting frames 12 and the reinforcement frame 225 so as to increase assembling stability and structural strength.

The multi-chamber semiconductor manufacturing system 1 further includes a load lock unit 40 and a vacuum pumping unit 50. In a length direction of the main body 11, the load lock unit 40 and the vacuum pumping unit 50 are located at two opposite sides of the transfer unit 30. The load lock unit 40 is configured to load and unload the substrate and can reduce pressure changes in the transfer chamber 31; the vacuum pumping unit 50 is configured to discharge a gas in the transfer unit 30 so as to maintain a vacuum degree in the transfer chamber 31 for continuous manufacturing and good processing quality. The multi-chamber semiconductor manufacturing system 1 preferably further includes an operation display interface 70 electrically connected with the plurality of processing units 20, the transfer unit 30, the load lock unit 40 and the vacuum pumping unit 50 so that the operation display interface 70 can control various parameters of the units mentioned above and is convenient to use. In other embodiments, the gas in the plurality of processing units may also be discharged from the vacuum pumping unit so as to integrate gas discharging pipelines, effectively reduce a space required for configuration and minimize the volume of the multi-chamber semiconductor manufacturing system.

Figure 5:
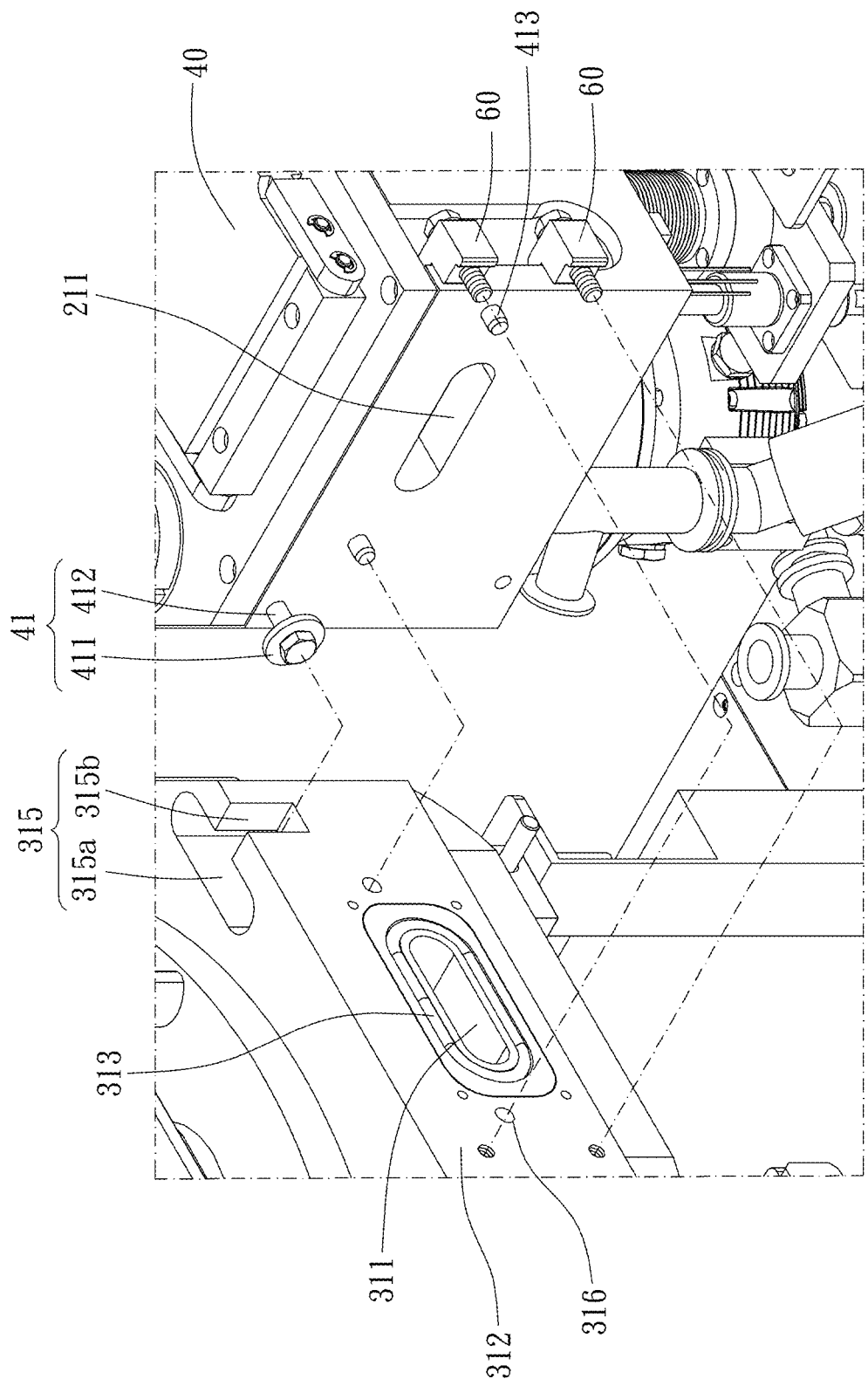
FIG. 5 is a partial enlarged breakdown drawing of a preferable embodiment of the present invention.
Figure 6:
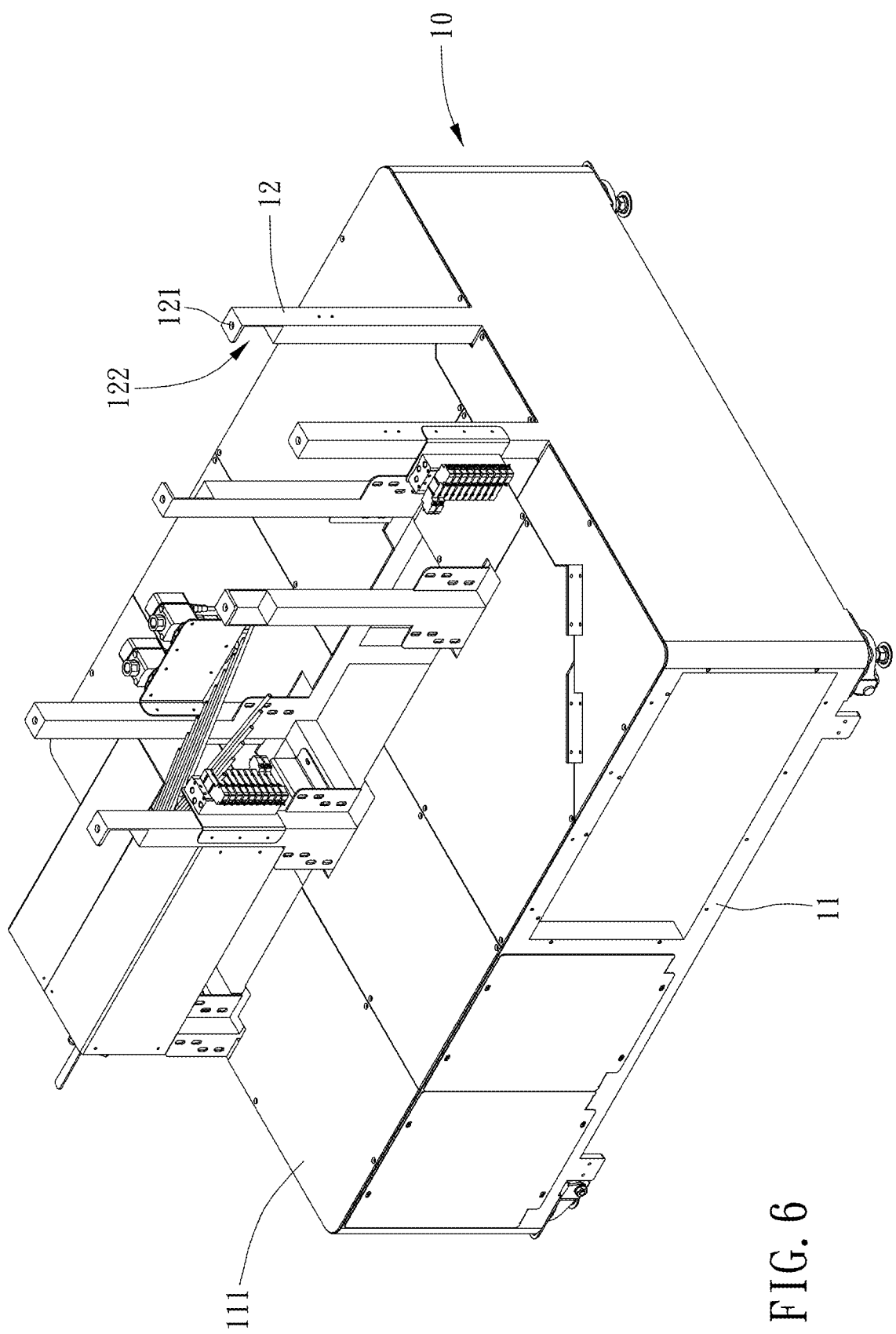
FIG. 6 is another partial stereogram according to a preferable embodiment of the present invention.

Please refer to FIG. 5, a sidewall of the load lock unit 40 facing the transfer chamber 31 has an engaging member 41 protrudingly disposed thereon, and the transfer chamber 31 further includes a slot 315 corresponding to the engaging member 41 and extending in the height direction. The slot 315 includes a broad section 315a and a narrow section 315b communicated with each other, and the engaging member 41 includes a head portion 411 received within the broad section 315a and a body portion 412 received within the narrow section 315b for easy positioning and stable assembling. A plurality of locking members 60 are disposed on two opposite sides of each of the plurality of processing units 20 and the load lock unit 40. One end of each of the plurality of locking members 60 is screwed to one of the plurality of sidewalls 312 of the transfer chamber 31, and another end of each of the plurality of locking members 60 is abutted against one of the plurality of processing units 20 and the load lock unit 40 in a direction toward the transfer chamber 31 so that each of the plurality of processing units 20 and the load lock unit 40 are respectively abutted against one of the plurality of sidewalls 312 of the transfer chamber 31 so as to be tightly assembled with one another. Preferably, each of the plurality of sidewalls 312 has two first positioning portions 316 located at two opposite sides of one of the plurality of first transfer channels 311, and each said processing chamber 21 and the load lock unit 40 respectively have two second positioning portions 413 correspondingly connected with the two first positioning portions 316. In this embodiment, each of the two first positioning portions 316 is a recess, and each of the two second positioning portions 413 is a projection inserted within one said recess so as to be stably positioned and assembled with each other.

However, numbers of said first positioning portions and said second positioning portions may be changed to meet different requirements; and the two first positioning portions and the two second positioning portions may be formed in other shapes.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A multi-chamber semiconductor manufacturing system, including:
   a base, including a main body and a plurality of supporting frames protrudingly disposed on a mounting surface of the main body;
   a plurality of processing units, connected to the plurality of supporting frames; and
   a transfer unit, connected to the plurality of supporting frames and located between the plurality of processing units, configured to transfer a substrate between the plurality of processing units;
   wherein as viewed in a height direction of the base, an outer contour of the base is rectangular, a length of the base is between 0.9 m and 1.2 m, and a width of the base is between 1.2 m and 1.5 m; the plurality of processing units and the transfer unit are integrated with the base, and a side of the main body opposite to the mounting surface has a plurality of casters disposed thereon.

2. The multi-chamber semiconductor manufacturing system of claim 1, wherein as viewed in the height direction of the base, each of the plurality of processing units does not protrude beyond the outer contour of the base.

3. The multi-chamber semiconductor manufacturing system of claim 1, wherein the transfer unit includes a transfer chamber, the transfer chamber has a plurality of first transfer channels circumferentially disposed thereon, and each of the plurality of processing units includes a processing chamber which includes a second transfer channel communicated with an interior of the processing chamber and being correspondingly communicatable with one of the plurality of first transfer channels.

4. The multi-chamber semiconductor manufacturing system of claim 3, wherein the transfer chamber includes a plurality of sidewalls connected transitionally with one another, each of the plurality of sidewalls has one of the plurality of first transfer channels disposed thereon, and an angle between adjacent two of the plurality of sidewalls is larger than or equal to 120 degrees.

5. The multi-chamber semiconductor manufacturing system of claim 4, wherein as viewed in the height direction of the base, each of the plurality of processing units does not protrude beyond the outer contour of the base; a connection assembly is disposed on a side of each of the plurality of processing units remote from the transfer unit, and each said connection assembly includes at least one abutting member connected with one of the plurality of processing units and at least one connecting rod connecting one said abutting member with one of the plurality of supporting frames; an end of each of the plurality of supporting frames remote from the mounting surface includes a connecting hole and a notch, and each said connecting rod is disposed through one said connecting hole and partially exposed from one said notch; at least a portion of the plurality of supporting frames is detachably assembled to the mounting surface; at least a portion of the plurality of supporting frames is integrally formed as a part of the main body; a side of a bottom wall of each said processing chamber remote from the transfer chamber has two engaging grooves spaced apart from each other, each said abutting member is embedded within one of the two engaging grooves; each said abutting member includes at least one first through hole and a second through hole, at least one fastener is disposed through the at least one first through hole and connects one said abutting member with one said processing chamber; each said connecting rod is a threaded rod penetrating through the second through hole, a plurality of nuts are screwed to the threaded rod and abutted against one said abutting member and one of the plurality of supporting frames; each said connection assembly further includes a reinforcement frame which is detachably connected with adjacent two of the plurality of supporting frames, one of the plurality of processing units is partially located between two said supporting frames and the reinforcement frame; as viewed in the height direction, the transfer chamber has an outer contour which is octagonal, and an angle between adjacent two of the plurality of sidewalls is 135 degrees; the multi-chamber semiconductor manufacturing system further includes a load lock unit and a vacuum pumping unit, in a length direction of the main body, the load lock unit and the vacuum pumping unit are located at two opposite sides of the transfer unit, the load lock unit is configured to load and unload the substrate, and the vacuum pumping unit is configured to discharge a gas in the transfer unit; a sidewall of the load lock unit facing the transfer chamber has an engaging member protrudingly disposed thereon, the transfer chamber further includes a slot corresponding to the engaging member and extending in the height direction, the slot includes a broad section and a narrow section communicated with each other, the engaging member includes a head portion received within the broad section and a body portion received within the narrow section; a plurality of locking members are disposed on two opposite sides of each of the plurality of processing units and the load lock unit, one end of each of the plurality of locking members is screwed to one of the plurality of sidewalls of the transfer chamber, and another end of each of the plurality of locking members is abutted against one of the plurality of processing units and the load lock unit in a direction toward the transfer chamber; each of the plurality of sidewalls has two first positioning portions located at two opposite sides of one of the plurality of first transfer channels, and each said processing chamber and the load lock unit respectively have two second positioning portions correspondingly connected with the two first positioning portions; and the multi-chamber semiconductor manufacturing system further includes an operation display interface electrically connected with the plurality of processing units, the transfer unit, the load lock unit and the vacuum pumping unit.

6. The multi-chamber semiconductor manufacturing system of claim 1, wherein a connection assembly is disposed on a side of each of the plurality of processing units remote from the transfer unit, and each said connection assembly includes at least one abutting member connected with one of the plurality of processing units and at least one connecting rod connecting one said abutting member with one of the plurality of supporting frames.

7. The multi-chamber semiconductor manufacturing system of claim 6, wherein an end of each of the plurality of supporting frames remote from the mounting surface includes a connecting hole and a notch, and each said connecting rod is disposed through one said connecting hole and partially exposed from one said notch.

8. The multi-chamber semiconductor manufacturing system of claim 1, wherein at least a portion of the plurality of supporting frames is detachably assembled to the mounting surface.

9. The multi-chamber semiconductor manufacturing system of claim 1, further including a load lock unit and a vacuum pumping unit, wherein in a length direction of the main body, the load lock unit and the vacuum pumping unit are located at two opposite sides of the transfer unit, the load lock unit is configured to load and unload the substrate, and the vacuum pumping unit is configured to discharge a gas in the transfer unit.

\* \* \* \* \*